United States Patent
Gupta

(10) Patent No.: US 11,876,436 B2
(45) Date of Patent: Jan. 16, 2024

(54) VOLTAGE DETECTING APPARATUS AND METHOD FOR SWITCHING POWER CONVERTERS

(71) Applicant: Halo Microelectronics International, Campbell, CA (US)

(72) Inventor: Milind Chandra Gupta, San Jose, CA (US)

(73) Assignee: Halo Microelectronic International, Campbell, CA (US)

( * ) Notice: Subject to any disclaimer, the term of this patent is extended or adjusted under 35 U.S.C. 154(b) by 154 days.

(21) Appl. No.: 17/457,950

(22) Filed: Dec. 7, 2021

(65) Prior Publication Data
US 2023/0179082 A1  Jun. 8, 2023

(51) Int. Cl.
*H02M 1/08* (2006.01)
*G01R 19/165* (2006.01)
*H02M 1/00* (2006.01)

(52) U.S. Cl.
CPC ........ *H02M 1/08* (2013.01); *G01R 19/16571* (2013.01); *H02M 1/0009* (2021.05)

(58) Field of Classification Search
CPC . H02M 3/155–1588; H02M 1/08–096; H02M 1/009
See application file for complete search history.

(56) References Cited

U.S. PATENT DOCUMENTS

| 2011/0248702 | A1 | 10/2011 | Kume |
| 2014/0328087 | A1* | 11/2014 | Tang ............. H02M 3/156 363/21.01 |
| 2015/0382429 | A1 | 12/2015 | Knoedgen et al. |
| 2018/0054113 | A1* | 2/2018 | Kim ............. H02M 1/15 |

FOREIGN PATENT DOCUMENTS

| CN | 101236218 A | 8/2008 |
| CN | 102621459 A | 8/2012 |
| CN | 105301342 A | 2/2016 |
| CN | 112994464 A | 6/2021 |

* cited by examiner

*Primary Examiner* — Peter M Novak
(74) *Attorney, Agent, or Firm* — AP3 Law Firm PLLC

(57) ABSTRACT

A method includes detecting a first current flowing through a first clamping device coupled to a gate of a power switch, determining whether an inductor current reduces to zero based upon a first comparison between the first current and a first predetermined current level, and after determining the inductor current reduces to zero, determining whether a drain voltage of the power switch enters a valley of a resonant ringing based upon a second comparison between the first current and the first predetermined current level.

20 Claims, 7 Drawing Sheets

VOLTAGE DETECTING APPARATUS AND METHOD FOR SWITCHING POWER CONVERTERS

TECHNICAL FIELD

The present invention relates to a voltage detecting apparatus and method for switching power converters, and, in particular embodiments, to an apparatus and method for detecting a voltage on a switching node of a power switch.

BACKGROUND

As technologies further advance, a variety of computing devices such as laptops, mobile phones, tablet PCs, digital cameras, MP3 players and/or the like, have become popular. A computing device receives power from a power source. The power source may be a power converter converting power from an alternating current (ac) or a direct current (dc) power supply to a regulated voltage fed into the computing device. The power converter may be implemented as a variety of power topologies such as boost converters.

A boost converter comprises an inductor, a transistor switch and a diode. A first output terminal of the rectifier is coupled to a first terminal of the inductor. A second terminal of the inductor is coupled to a drain of the transistor switch and an anode of the diode. A cathode of the diode is coupled to a first terminal of the output port of the power conversion system. A second output terminal of the rectifier is coupled to a source of the transistor switch and a second terminal of the output port of the power conversion system, and further coupled to a ground node. A controller is employed to generate a gate drive signal applied to the gate of the transistor switch. The gate drive signal determines whether the transistor switch is conductive (the switch is closed) or non-conductive (the switch is open).

In operation, when the transistor switch is conductive (the switch is closed), a current flows in a conductive path including the inductor and the transistor switch. After the transistor switch has been closed, the diode is reverse-biased by the output voltage. The current flowing through the inductor stores energy in the inductor. When the transistor switch is non-conductive (the switch is open), the energy stored in the inductor is transferred to the output by a current flowing through the diode.

In operation, a controller needs to determine when the inductor current goes to zero so that the controller can start another energy transfer cycle. Additionally, the controller may not turn on the transistor switch until the inductor enters into a resonant ringing with the parasitic capacitance of the transistor switch. In the resonant ringing, the controller can achieve zero voltage switching through turning on the transistor switch when the drain of the transistor switch reaches a valley of the resonant ringing.

To find when the inductor current goes to zero, and when the drain of the transistor switch reaches the valley of the resonant ringing, a plurality of known solutions can be utilized. In a first known solution, a resistor divider is connected between the drain and source of the transistor switch. When a logic high signal is applied to the gate of the transistor switch through a driver, the drain of the transistor switch is low. When a logic low signal is applied to the gate of the transistor switch through the driver, the drain voltage flies up and gets clamped to an output voltage of the boost converter. Subsequently, when the inductor current goes to zero, the resonant ringing starts on the drain of the transistor switch. The output of the resistor divider is used to sense the drain voltage. By employing appropriate thresholds and additional compensation capacitors across the resistors, the controller is able to determine when the inductor current goes to zero (e.g., the inductor current goes to zero when the drain voltage starts to fall after getting clamped to the output voltage), and when the drain voltage reaches the valley of the resonant ringing.

In a second known solution, a capacitor is connected between the drain of the transistor switch to a sense pin. The capacitor functions as a high pass filter or a differentiator to pass current. The capacitor can be terminated by a resistor, and the voltage across the resistor is indicative of the drain voltage. By employing appropriate thresholds, the controller is able to determine when the inductor current goes to zero, and when the drain voltage reaches the valley of the resonant ringing.

In a third known solution, an auxiliary winding is coupled to the inductor to step down the voltage across the inductor. The controller uses the stepped down voltage as the sensed voltage of the drain terminal of the transistor switch.

The three known solutions above all require external components to sense the voltage on the drain of a power switch, and all three known solutions require a dedicated connection to the controller (usually a pin on the controller package) to receive the sensing signal. The external components cause unnecessary system complexity and reduced reliability, while the dedicated pin increases the packaging cost. It would be desirable to have a simple apparatus and method to determine when the inductor current goes to zero, and when the drain voltage of the power switch reaches a valley of a resonant ringing so that the controller is able to start a new energy transfer cycle after the inductor current goes to zero, and turn on the power switch when the drain voltage of the power switch reaches the valley of the resonant ringing without the need of an dedicated pin on the controller package. The present disclosure addresses this need.

SUMMARY

These and other problems are generally solved or circumvented, and technical advantages are generally achieved, by preferred embodiments of the present disclosure which provide an apparatus and method for detecting a voltage on a switching node of a power switch.

In accordance with an embodiment, a method comprises detecting a first current flowing through a first clamping device coupled to a gate of a power switch, determining whether an inductor current reduces to zero based upon a first comparison between the first current and a first predetermined current level, and after determining the inductor current reduces to zero, determining whether a drain voltage of the power switch enters a valley of a resonant ringing based upon a second comparison between the first current and the first predetermined current level.

In accordance with another embodiment, a controller comprises a driver configured to drive a power switch, the driver comprising a high-side switch and a low-side switch connected in series, and a first clamping device configured to detect a first current indicative of when an inductor current reduces to zero, and when a drain voltage of the power switch enters a valley of a resonant ringing.

In accordance with yet another embodiment, a system comprises a power converter comprising an inductor and a power switch connected in series between an input port and ground, and a controller configured to generate a gate drive signal fed into a gate of the power switch, wherein the controller comprises a driver configured to drive the power switch, a first clamping device configured to detect a first current indicative of when an inductor current reduces to zero, and when a drain voltage of the power switch enters a valley of a resonant ringing, and a second clamping device configured to detect a second current indicative of when the drain voltage of the power switch exits the valley of the resonant ringing.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an apparatus and method for sensing a drain voltage of a power switch in a boost converter. The invention may also be applied, however, to a variety of power conversion systems including buck converters, motor drivers, flyback converters and the like. Hereinafter, various embodiments will be explained in detail with reference to the accompanying drawings.

Figure 1:
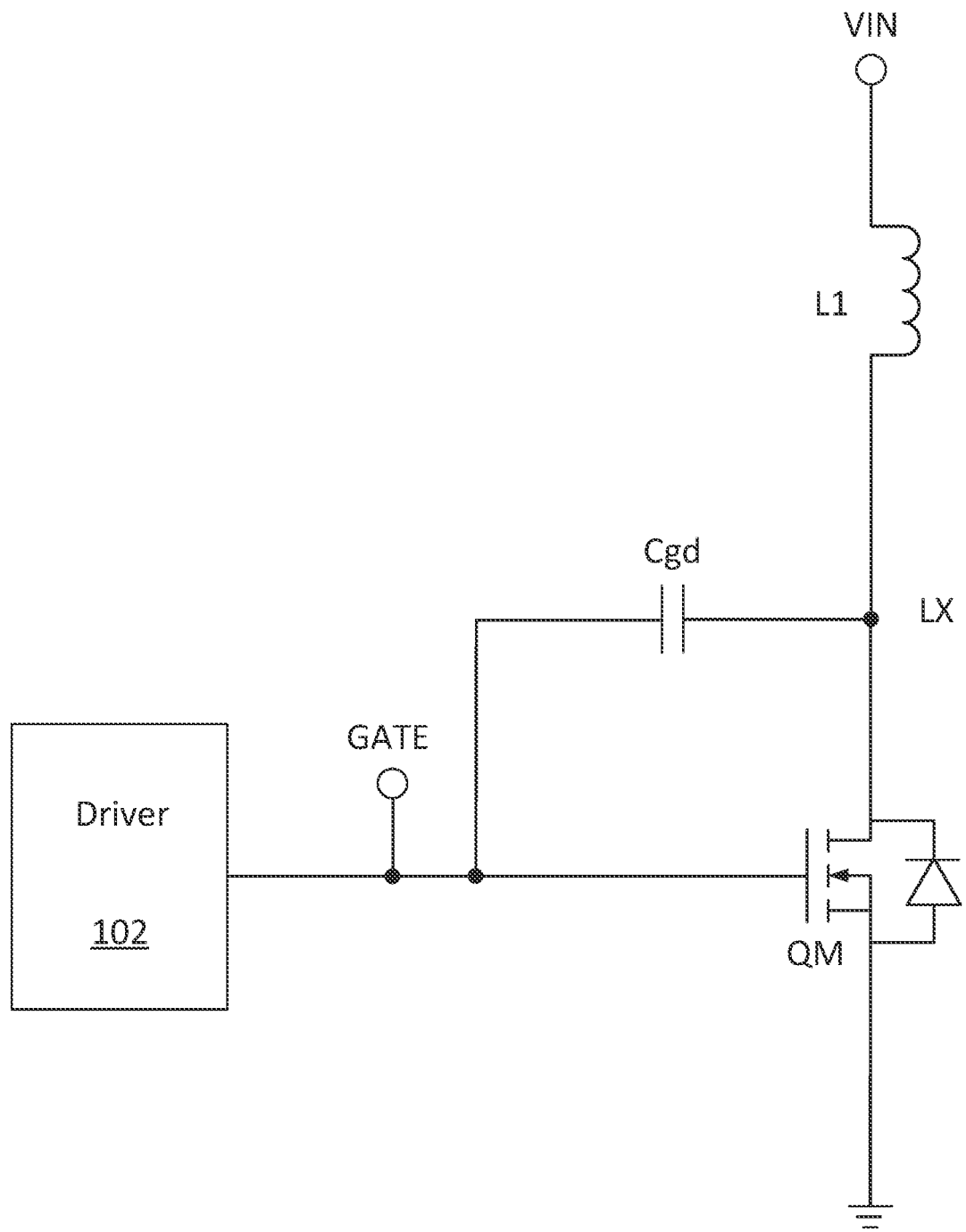
FIG. 1 illustrates a block diagram of a driver configured to drive a power switch in accordance with various embodiments of the present disclosure.

FIG. 1 illustrates a block diagram of a driver configured to drive a power switch in accordance with various embodiments of the present disclosure. An inductor L1 and a power switch QM are connected in series between an input terminal VIN and ground. The common node of L1 and QM is also known as a switching node. As shown in FIG. 1, the switching node is denoted as LX. In some embodiments, L1 and QM are part of a boost converter. In alternative embodiments, L1 and QM may be part of other suitable power conversion systems such as flyback converters.

As shown in FIG. 1, a driver 102 is configured to generate a gate drive signal fed into the gate of the power switch QM. In some embodiments, the driver 102 is part of a controller (not shown). In alternative embodiments, the driver 102 is a standalone circuit coupled between the controller and the power switch QM. A capacitor Cgd is coupled between the gate (GATE) and the drain of QM. Cgd represents the parasitic capacitance formed between the gate and the drain of QM.

In accordance with an embodiment, the switch of FIG. 1 may be one or a plurality of MOSFET devices. Alternatively, the switching element can be any controllable switches such as insulated gate bipolar transistor (IGBT) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, gallium nitride (GaN) based power devices, silicon carbide (SiC) based power devices and the like.

It should be noted while FIG. 1 shows the switch is implemented as a single n-type transistor, a person skilled in the art would recognize there may be many variations, modifications and alternatives. For example, depending on different applications and design needs, the switch may be implemented as a p-type transistor. Furthermore, the switch shown in FIG. 1 may be implemented as a plurality of switches connected in parallel. Moreover, a capacitor may be connected in parallel with the switch to achieve zero voltage switching (ZVS)/zero current switching (ZCS).

In some embodiments, the driver 102 is part of a boost converter controller. The controller comprises the driver 102, a first clamping device and a second clamping device. The driver 102 is configured to drive the power switch QM. The driver 102 comprises a high-side switch and a low-side switch connected in series. In some embodiments, when the inductor current of the boost converter reduces to zero, a drain voltage of the power switch QM enters into a resonant ringing. The first clamping device is configured to detect a first current indicative of when the inductor current of the boost converter reduces to zero, and when the drain voltage of the power switch QM enters a valley of the resonant ringing. The second clamping device is configured to detect a second current indicative of when the drain voltage of the power switch exits the valley of the resonant ringing.

One advantageous feature of having the first clamping device and the second clamping device is that external components are not required for sensing the drain voltage of QM. In particular, the parasitic capacitance between the drain and gate of QM function s as a high pass filter. The drain voltage of QM can be sensed at the GATE terminal during the turn-off time of QM. The detailed structures and operating principles of the first clamping device and the second clamping device will be described below with respect to FIGS. 2-7.

It should be noted that the drain voltage detecting apparatus and method describe above can be employed in other suitable applications. For example, the drain voltage detecting apparatus and method describe above may be used in the break-before-make (BBM) operation of a buck converter. The BBM operation occurs when both the high-side switch and the low-side switch of the buck converter are in an off state during every switching transition. The BBM operation is employed to prevent the input power source from being shorted.

In operation, after one of the switches is turned off, and the controller applies a BBM timing gap before turning on the other switch. The controller can apply a suitable BBM timing gap by sensing the drain voltage of the switch being turned off, and based on the sensed drain voltage, the controller then generates the turn-on signal for the other switch. This is problematic if these two switches are on two different chips. Most of the time, in order to prevent the input power source from being shorted, a fixed delay is implemented which is designed to be sufficient in all operating conditions. Hence, a large margin is in the fixed delay. Unnecessary delays affect the efficiency or systems operating in the continuous conduction mode since during that time, the inductor current flows through the body diode of the switch that needs to be turned on. The drain voltage detecting apparatus and method describe above can be used to sense when one switch has been turned off, and when it is safe to turn on the other switch.

Figure 2:
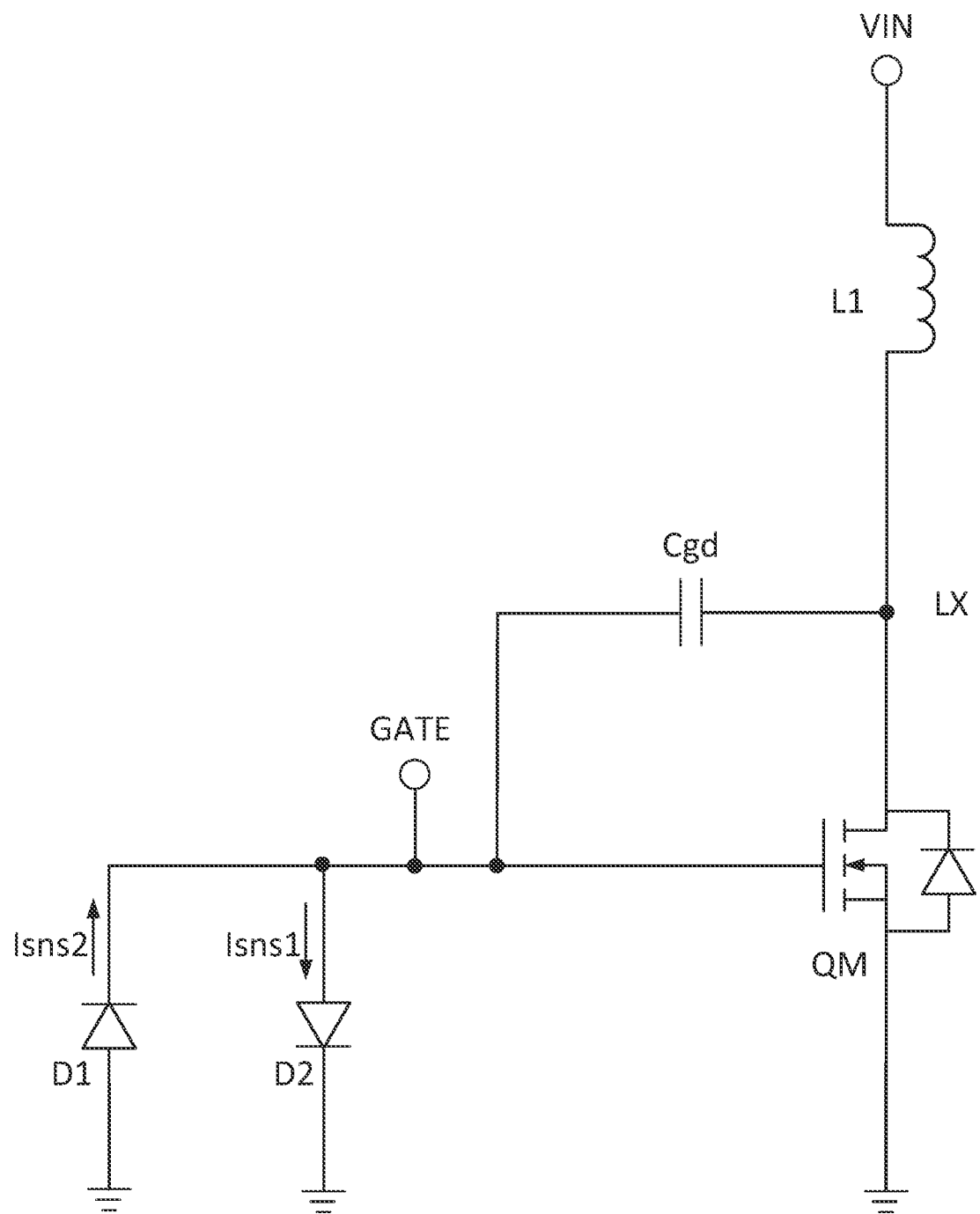
FIG. 2 illustrates a schematic diagram of clamping circuits in accordance with various embodiments of the present disclosure.

FIG. 2 illustrates a schematic diagram of clamping circuits in accordance with various embodiments of the present disclosure. The clamping circuits comprise a first clamping device and a second clamping device. As shown in FIG. 2, the first clamping device is a first diode D1 having an anode coupled to ground and a cathode coupled to the gate of the power switch QM. The second clamping device is a second diode D2 having an anode coupled to the gate of the power switch QM and a cathode coupled to ground. The first diode D1 and the second diode D2 form a bidirectional clamp.

As shown in FIG. 2, a parasitic capacitor Cgd is connected between the GATE terminal and the switching node LX. Cgd is used to sense the voltage on the node LX. In a conventional driver, when the power switch QM is turned off, the gate of the power switch QM is held to ground through a low impedance switch (e.g., the turned-on low-side switch of the driver). In the present disclosure, the gate of the power switch QM is not held to ground throughout the turn-off time of the power switch QM. Instead, the gate of the power switch QM is driven to ground for a short period of time to turn it off and then left floating for the rest of the turn-off time of QM. A bidirectional clamp (D1 and D2) is applied to the gate of QM. The clamp voltages of the bidirectional clamp are much lower than the threshold voltages of QM. As such, the bidirectional clamp keeps QM in an off state through the rest of the turn-off time of QM.

In operation, the voltage on the LX node may fly down after QM has been turned off. For example, when the inductor current goes to zero. The voltage on the LX node enters into a resonant ringing. In the resonant ringing, the voltage on the LX starts to drop. The capacitor Cgd pushes down the voltage on the GATE terminal which gets clamped by diode D1. A current Isns2 flows through the diode D1. This current discharges Cgd as the voltage on the LX node goes down further. Since the voltage on the GATE terminal is fixed by the clamp (D1), the voltage across Cgd is about the same as the voltage on the LX node. Isns2 is the current flowing through Cgd. Isns2 can be expressed by the following equation:

$$Isns2 = Cgd\frac{dV_{LX}}{dt} \quad (1)$$

In Equation (1), $V_{LX}$ is the voltage on LX.

Equation (1) shows the current Isns2 is proportional to the derivative of the voltage on the LX node. As such, the falling of the voltage on the LX node can be determined by finding when Isns2 becomes positive. Furthermore, at a valley of the resonant ringing, the derivative of the voltage on the LX node is equal to zero. As such, the valley of the resonant ringing can be determined by finding when Isns2 reduces to zero. It should be noted when Isns2 goes to zero, Isns1 becomes positive. When Isns1 becomes positive, Isns1 can be expressed by the following equation:

$$Isns1 = Cgd\frac{dV_{LX}}{dt} \quad (2)$$

Equation (2) shows the current Isns1 is also proportional to the derivative of the voltage on the LX node. As such, the rising of the voltage on the LX node (exiting the valley of resonant ringing) can be determined by finding when Isns1 becomes positive. Furthermore, at a peak of the resonant ringing, the derivative of the voltage on the LX node is equal to zero. As such, the peak of the resonant ringing can be determined by finding when Isns1 reduces to zero. It should be noted when Isns1 goes to zero, Isns2 becomes positive as the ringing cycle repeats itself.

The valley of the resonant ringing can be detected by using the derivative of the voltage on the LX node. It should be noted that the derivative at the valley has the highest rate of change which makes it easier to detect the valley region since comparators would react faster with a faster ramp rate at their inputs.

FIG. 2 illustrates the basic theory of how to find the falling of the voltage on the LX node (when the inductor current goes to zero) and the valley of the resonant ringing. One detailed implementation based on the basic theory described above will be discussed below with respect to FIG. 3.

One advantageous feature of having the clamping circuits shown in FIG. 2 is that the clamping circuits simplify the design of the controller by eliminating external components that are normally needed in a conventional controller to sense the drain voltage. Furthermore, the clamping circuits shown in FIG. 2 are able to avoid noise coupling in a noisy printed circuit board (PCB) environment.

Another advantageous feature is that the clamping circuits shown in FIG. 2 eliminate the need of having a separate pin for sensing the drain voltage. Furthermore, when the clamping circuits are used in the BBM operation of a buck converter, the clamping circuits shown in FIG. 2 help to avoid the usage of any high voltage devices which are needed to transfer the signal from the high voltage domain to the low voltage domain or vice versa.

Figure 3:
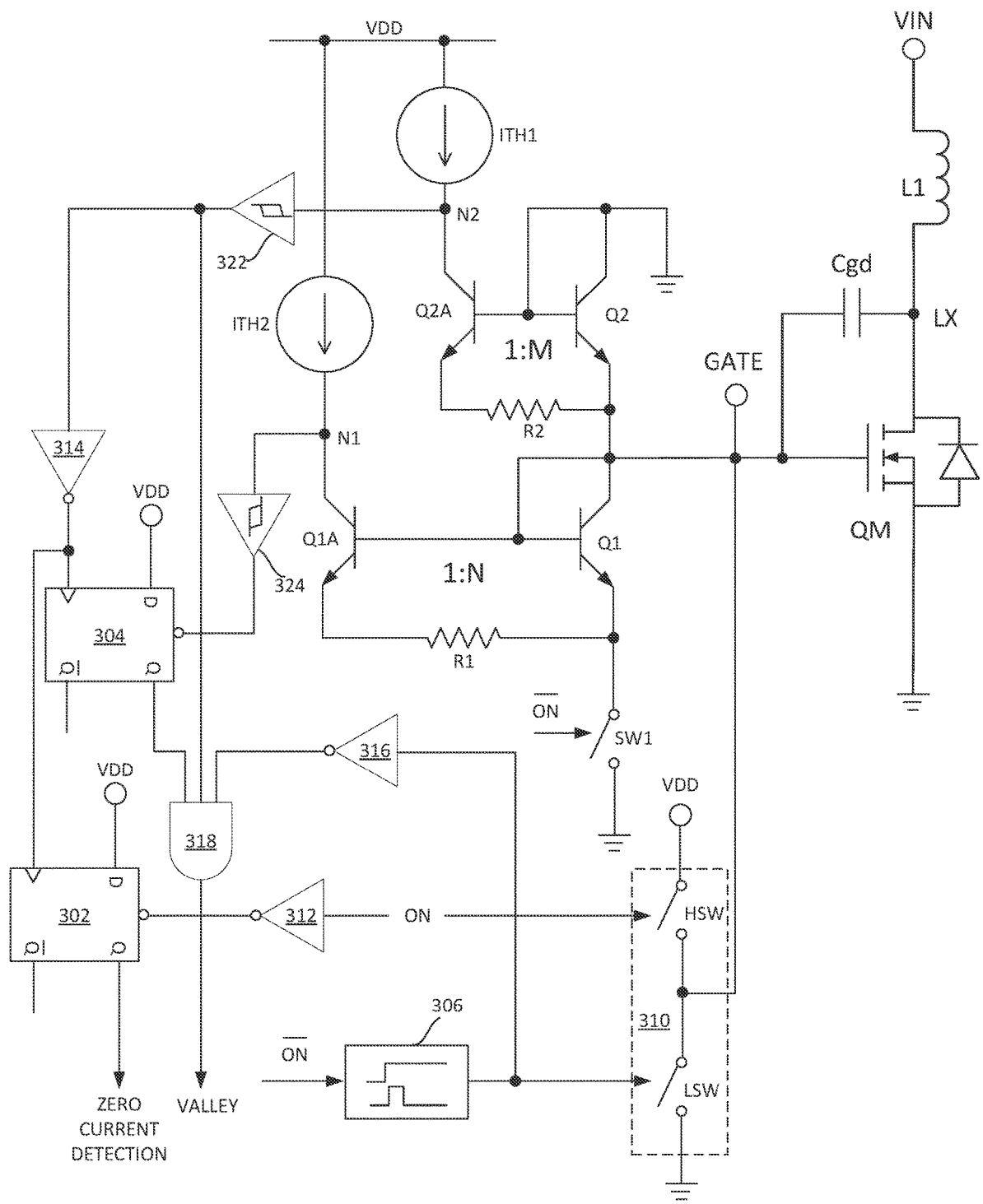
FIG. 3 illustrates a schematic diagram of a voltage detecting circuit in a controller in accordance with various embodiments of the present disclosure.

FIG. 3 illustrates a schematic diagram of a voltage detecting circuit in a controller in accordance with various embodiments of the present disclosure. The controller comprises a drive circuit 310, a first diode and a second diode. The first diode is a first diode-connected transistor Q2. The second diode is a second diode-connected transistor Q1. The drive circuit 310 comprises a high-side switch HSW and a low-side switch LSW connected in series between a bias voltage VDD and ground. The common node of the high-side switch HSW and the low-side switch LSW is connected to the GATE terminal of QM.

The controller further comprises a first transistor Q2A and a first current source ITH1. The first transistor Q2A and the first diode-connected transistor Q2 form a first current mirror having a current conversion ratio of 1:M as shown in FIG. 3. M is the ratio of the current mirror formed by Q2 and Q2A (e.g., the current flowing through the Q2 device is M times greater than the current flowing through the Q2A device). R2 is an optional resistor. R2 may be used to increase the current mirror ratio even further (more than M) through degenerating the strength of Q2A. The first current source ITH1 is connected in series with the first transistor Q2A. The first current source ITH1 is configured to generate a first predetermined current level for determining whether the inductor current reduces to zero, and whether the drain voltage of the power switch QM enters the valley of the resonant ringing. It should be noted that in some embodiments, when the inductor current reduces to zero, the drain voltage of the power switch QM enters into the resonant ringing. The detailed operating principle of ITH1 will be discussed below with respect to FIG. 4.

The controller further comprises a second transistor Q1A and a second current source ITH2. The second transistor Q1A and the second diode-connected transistor Q1 form a second current mirror having a current conversion ratio of 1:N as shown in FIG. 3. N is the ratio of the current mirror formed by Q1 and Q1A (e.g., the current flowing through the Q1 device is N times greater than the current flowing through the Q1A device). R1 is an optional resistor. R1 may be used to increase the current mirror ratio even further (more than M) through degenerating the strength of Q1A. The second current source ITH2 is connected in series with the second transistor Q1A. The second current source ITH2 is configured to generate a second predetermined current level for determining when the drain voltage of the power switch QM exits the valley of the resonant ringing. The detailed operating principle of ITH2 will be discussed below with respect to FIG. 4.

The controller further comprises a first flip-flop circuit 302, a second flip-flop circuit 304 and a one-shot circuit 306. The first flip-flop circuit 302 has a clock input coupled to a common node of the first current source ITH1 and the first transistor Q2A, a data input coupled to a bias voltage source VDD, a clear input configured to receive a turn-on signal (ON) of the power switch QM through a first inverter 312, and an output configured to generate a first signal indicative of when the inductor current reduces to zero.

It should be noted when the inductor current goes to zero, the drain voltage of the power switch QM enters into the resonant ringing. As shown in FIG. 3, the rising edge of the output signal (ZERO CURRENT DETECTION) of the first flip-flop circuit 302 is used to indicate when the inductor current goes to zero.

The second flip-flop circuit 304 has a clock input coupled to the common node of the first current source ITH1 and the first transistor Q2A, a data input coupled to the bias voltage source VDD, a clear input coupled to a common node of the second current source ITH2 and the second transistor Q1A, and an output configured to generate a second signal (VALLEY) indicative of when the drain voltage of the power switch QM enters the valley of the resonant ringing.

The one-shot circuit 306 has an input configured to receive an inverted signal of the turn-on signal of the power switch QM, and an output configured to generate a short pulse. In some embodiments, the short pulse is configured such that after the short pulse finishes, the low-side switch LSW operates in a high impedance state.

The controller further comprises a switch SW1, a first Schmitt trigger 322, a second Schmitt trigger 324 and an AND gate 318. The switch SW1 is connected between the second diode-connected transistor Q1 and ground. The gate of the switch SW1 is controlled by an inverted signal of the turn-on signal of QM. In operation, the switch SW1 is configured to be turned off after the turn-on signal (ON) is applied to the power switch QM, essentially disabling the clamping circuit when GATE terminal of QM goes high.

The first Schmitt trigger 322 and a second inverter 314 are connected in series between the common node (N2) of the first current source ITH1 and the first transistor Q2A, and the clock inputs of the flip-flop circuits 302 and 304. The second Schmitt trigger 324 is connected between the common node (N1) of the second current source ITH2 and the second transistor Q1A, and the clear input of the second flip-flop circuit 304. The AND gate 318 has a first input connected to the output of the second flip-flop circuit 304, a second input connected to a common node of the first Schmitt trigger 322 and the second inverter 314, a third input connected to the output of the one-shot circuit 306 through a third inverter 316.

It should be noted that in a conventional driver, the high-side switch HSW and the low-side switch LSW are driven in a complementary manner. In the present disclosure, the low-side switch LSW is only driven momentarily, and then the low-side switch LSW is turned off and becomes a high impedance path. After the low-side switch LSW has been turned off, the GATE terminal is driven only by the capacitor Cgd.

Figure 4:
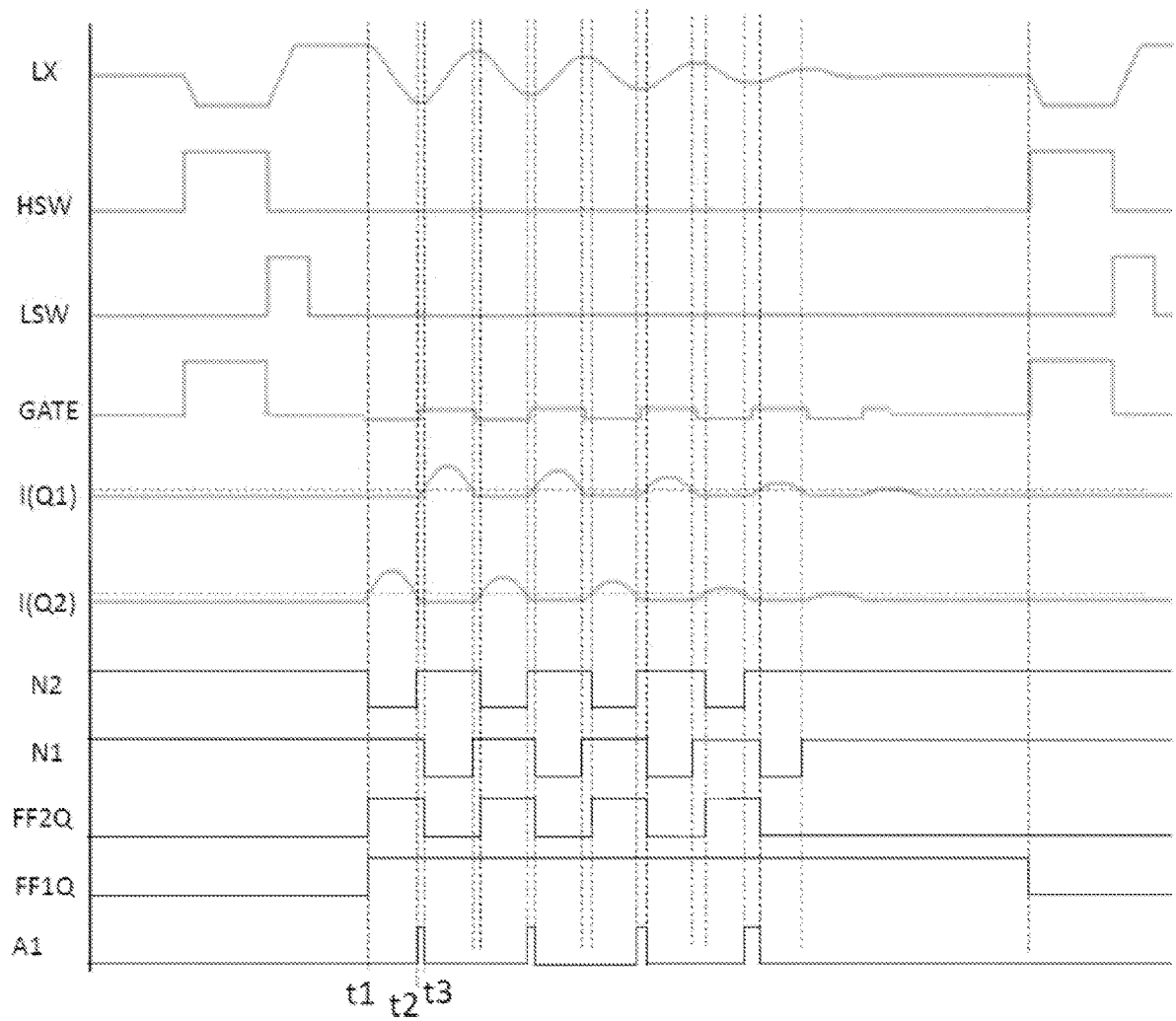
FIG. 4 illustrates various waveforms associated with the circuit shown in FIG. 3 in accordance with various embodiments of the present disclosure.

FIG. 4 illustrates various waveforms associated with the circuit shown in FIG. 3 in accordance with various embodiments of the present disclosure. The horizontal axis of FIG. 4 represents intervals of time. There may be eleven rows in FIG. 4. The first row represents the voltage on the LX node. The second row represents the gate drive signal of the high-side switch HSW. The third row represents the gate drive signal of the low-side switch LSW. The fourth row represents the voltage on the GATE terminal. The fifth row represents the current flowing through Q1, and the horizontal dotted line intercepting I(Q1) represents N times the second predetermined current level set by current source ITH2. The sixth row represents the current flowing through Q2, and the horizontal dotted line intercepting I(Q2) represents M times the first predetermined current level set by current source ITH1. The seventh row represents the signal at the common node (N2) of the first current source ITH1 and the first transistor Q2A. The eighth row represents the signal at the common node (N1) of the second current source ITH2 and the second transistor Q1A. The ninth row represents the signal at the non-inverting output terminal of the first flip flop circuit 302. The tenth row represents the signal at the non-inverting output terminal of the second flip flop circuit 304. The eleventh row represents the signal at the output of the AND gate 318.

At t1, the voltage on the LX node starts to go down. The voltage at the GATE terminal is pulled down by the voltage on the LX node until Q2 clamps the GATE terminal to a voltage potential equal to one diode drop below ground. Referring back to FIG. 3, the current in Q2 is mirrored and divided by the ratio 1:M. In other words, the current flowing through Q2A is equal to 1/M of the current flowing through Q2.

Referring back to FIG. 3, the resistor R2 is optional. R2 is employed to further reduce the current flowing through Q2A by lowering the voltage drop across the base and emitter junction of the first transistor Q2A. The current flowing in Q2A is compared to the current flowing through the current source ITH1. When the current in Q2A is greater than the current flowing through the current source ITH1, the voltage on the node N2 is pulled low as shown in FIG. 4. In response to this voltage change on the node N2, the output (FF1Q in FIG. 4) of the first flip-flop circuit 302 generates a logic high signal indicating that a zero current detection event (the inductor current goes to zero) has occurred. The voltage change on the node N2 also sets the output (FF2Q in FIG. 4) of the second flip-flop circuit 304 to make the valley detection ready.

From t1 to t2, the current in Q2 rises to the peak and then back down again. At t2, the voltage on the LX node enters the first valley of the resonant ringing. Before entering the valley, the current in Q2A drops below ITH1. At this point, the voltage on the node N2 is pulled up as shown in FIG. 4, and the output (A1 in FIG. 4) of the AND gate 318 generates a logic high signal indicating that the valley region has started.

As shown in FIG. 4, from t1 to t2, the GATE terminal is clamped by Q2 until the voltage on the LX node enters the valley of the resonant ringing. At this point, the voltage on the LX node starts to rise back up again. The change of the voltage on the LX node pulls up the GATE terminal. As a result, Q2 is turned off. The voltage on the GATE terminal keeps rising until the GATE terminal is clamped by Q1. Similar to the discussion above, an attenuated current may flow in Q1A at this time. When this current is greater than ITH2, the voltage on the node N1 is pulled down at t3. The voltage change on the node N1 resets the second flip-flop circuit 304. At t3, the output (FF2Q in FIG. 4) of the second flip-flop circuit 304 generates a logic low signal, which makes the output (A1 in FIG. 4) of the AND gate 318 generate a logic low signal indicating that the valley region has ended.

It should be noted the circuit shown in FIG. 3 shows the high-level concept of the voltage detection circuit. In an actual implementation, there may be many modifications. For example, the nodes N1 and N2 may not be allowed to swing all the way to the rails to speed up the detection, and high-speed comparators might be used to create the digital signals representing the state of the nodes N1 and N2. Furthermore, Q1A, ITH1, Q2A and ITH2 can be placed in the input stages of the high-speed comparators.

It should further be noted that the second flip-flop circuit 304 and the associated circuit may be optional. For example, in the applications in which detecting when the inductor current reduces to zero (the voltage on the LX node starts to fall) is the only requirement, the second flip-flop circuit 304 and the associated circuit may not be included.

It should be noted that M and N can be kept the same or different depending on the frequency of the resonant ringing and the positioning of the valley window desired. The time after which the GATE terminal is made high impedance may be adjustable depending on when the controller is ready to sense the drain voltage. It is not a fixed value. The current scaling in the current mirror may be implemented using different mirroring schemes. Moreover, the current through the clamp may be sensed using any other suitable solutions such as using a series resistor or sensing the voltage drop across a switch in series with the clamp. Furthermore, the resistors R1 and R2 may be adaptively tuned by looking at the pulse width of the valley signal generated by the AND gate 318. In some embodiments, increasing the values of R1 and R2 may increase the width of the valley pulse because the increased values of R1 and R2 provide more attenuation to the currents flowing through Q1A and Q2A.

Figure 5:
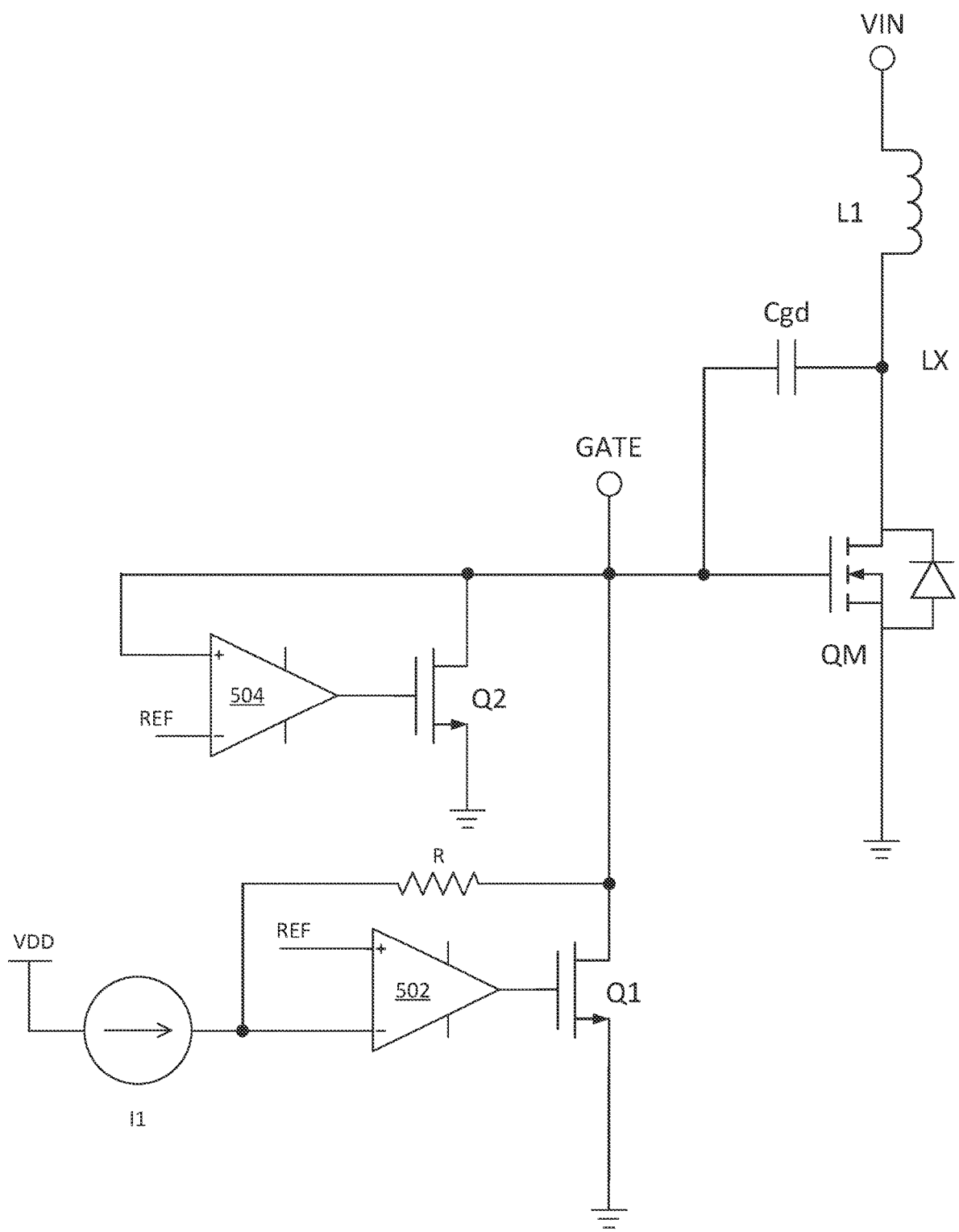
FIG. 5 illustrates a schematic diagram of another implementation of the clamping devices shown in FIG. 3 in accordance with various embodiments of the present disclosure.

FIG. 5 illustrates a schematic diagram of another implementation of the clamping devices shown in FIG. 3 in accordance with various embodiments of the present disclosure. In some embodiments, the first clamping device is a first active clamp comprising a first switch Q1, a resistor R, a first amplifier 502 and a current source I. As shown in FIG. 5, the first switch Q1 has a drain connected to the gate of the power switch QM and a source connected to ground. The first amplifier 502 has an inverting input connected to the current source I1, a non-inverting input configured to receive a reference REF and an output connected to a gate of the first switch Q1. The resistor R is connected between the inverting input of the first amplifier 502 and the gate of the power switch QM. In some embodiments, I1×R is equal to 2×REF. As such, the first active clamp is able to generate a voltage clamp equal to –REF at the drain of Q1. In other words, the first clamping device is configured to provide a negative voltage clamp for the gate of the power switch QM.

Similar to the circuit shown in FIG. 3, the voltage LX on the drain of the power switch QM is coupled to the GATE node of the power switch QM. As the inductor current reduces to zero, the voltage on LX starts to drop. The reduced voltage on LX drives the GATE node below zero until the voltage on the GATE node reaches –REF, where the output of the first amplifier 502 starts to gradually turn on the first switch Q1 to clamp the voltage on the GATE node at –REF. In this process, the current flowing through the first switch Q1 represents the derivative of the voltage on LX. A simple current mirror could be added to the first switch Q1 to bring out the current flowing through Q1 for further processing in the circuit shown in FIG. 3 to generate the signal indicating when the inductor current reduces to zero.

The second clamping device is a second active clamp comprising a second switch Q2 and a second amplifier 504. The second switch Q2 has a drain connected to the gate of the power switch QM and a source connected to ground. The second amplifier 504 has a non-inverting input connected to the gate of the power switch QM, an inverting input configured to receive the reference REF, and an output connected to a gate of the second switch Q2. The second clamping device is configured to provide a positive voltage clamp (REF) for the gate of the power switch QM.

Similarly, as the resonant ringing of the voltage on the LX node exits the first valley, the voltage on the GATE node increases to a level equal to REF. The output of the second amplifier 504 starts to gradually turn on the second switch Q2 to clamp the voltage on the GATE node to REF. In this process, the current flowing through the second switch Q2 also represents the derivative of the voltage LX on the drain of the power switch QM. A simple current mirror could also be added to the second switch Q2 to bring out the current flowing through Q2 for further processing in the circuit shown in FIG. 3 to generate the signal indicating the valley of the voltage on the LX node.

Figure 6:
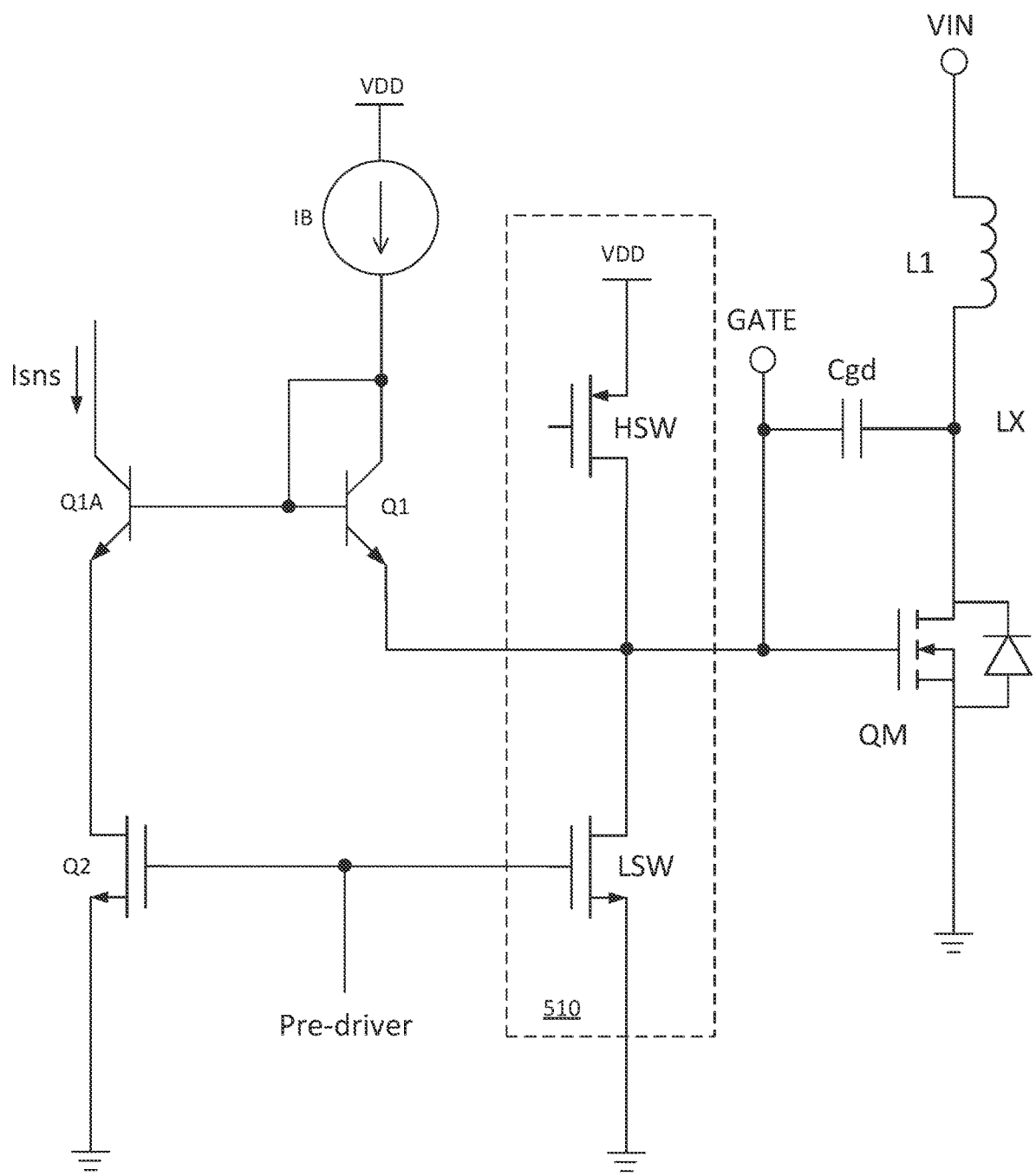
FIG. 6 illustrates a schematic diagram of another implementation of the controller shown in FIG. 3 in accordance with various embodiments of the present disclosure.

FIG. 6 illustrates a schematic diagram of another implementation of the controller shown in FIG. 3 in accordance with various embodiments of the present disclosure. In some embodiments, the low-side switch LSW is configured to generate a signal indicative of when the drain voltage of the power switch QM exits the valley of the resonant ringing. As shown in FIG. 6, the current is sensed directly from the low-side switch LSW. In this case, the low-side switch LSW is not turned off to make a high impedance path connected to the gate of QM. This scheme may be used in the applications having a large Cgd or having a high resonant frequency causing a large current coming out from the Cgd.

In operation, Q2 and LSW form a current mirror circuit. Both the gate of Q2 and the gate of LSW are connected to the same pre-driver input signal. The drain node of Q2 is coupled to the GATE node (the drain node of LSW) through transistors Q1A and Q1, where the similar base to emitter voltage drop of Q1A and Q1 ties the voltage of the drain node of Q2 to the voltage on the GATE node, which in turn allows the current flowing through LSW to be mirrored to the current Isns flowing through transistor Q1A and Q2. Similarly, the sensed current Isns can be used to determine whether the inductor current goes to zero.

Figure 7:
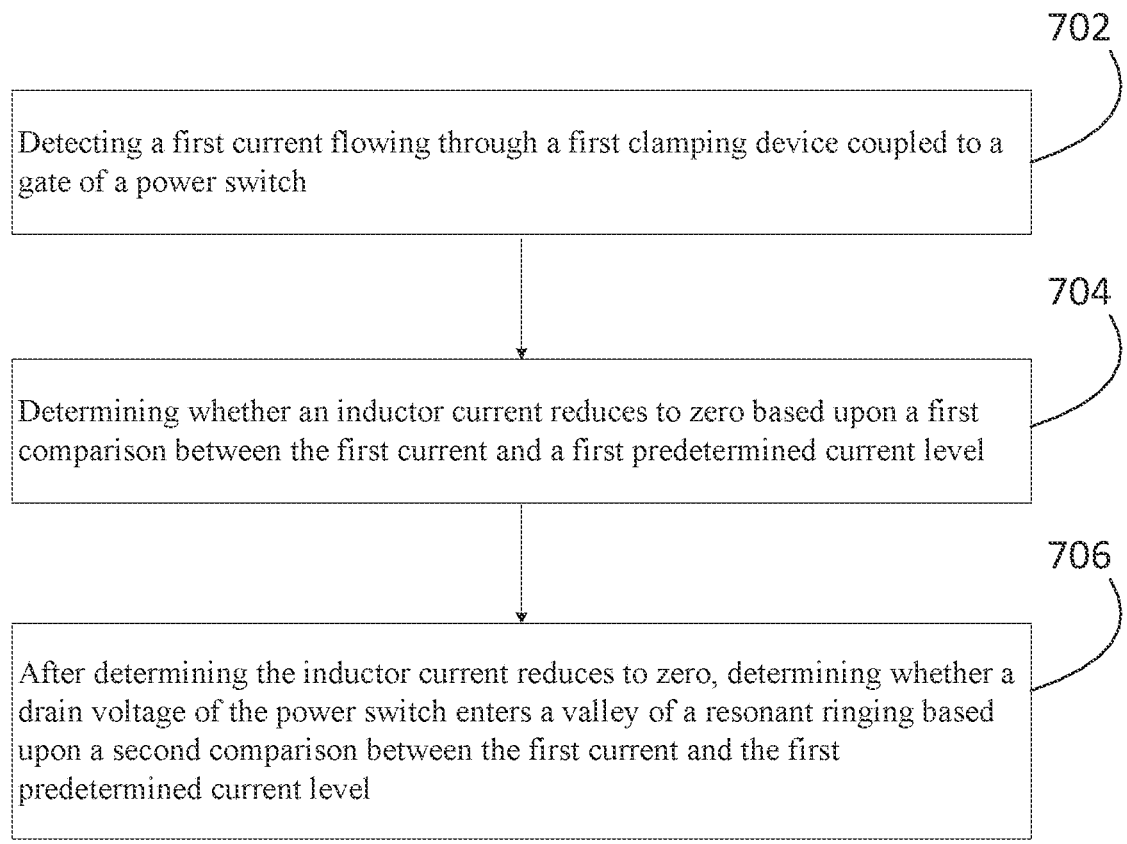
FIG. 7 illustrates a flow chart of a control method for detecting a drain-to-source voltage of the power switch shown in FIG. 1 in accordance with various embodiments of the present disclosure.

FIG. 7 illustrates a flow chart of a control method for detecting a drain-to-source voltage of the power switch shown in FIG. 1 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

A power converter (e.g., a boost converter) comprises an inductor and a power switch connected in series between an input port and ground. A controller is configured to generate a gate drive signal fed into a gate of the power switch. The controller comprises a driver, a first clamping device and a second clamping device. The driver is configured to drive the power switch. The first clamping device is configured to detect a first current indicative of whether the inductor current reduces to zero, and whether the drain voltage of the power switch enters a valley of the resonant ringing. The second clamping device is configured to detect a second current indicative of when the drain voltage of the power switch exits the valley of the resonant ringing.

At step 702, a first current flowing through a first clamping device coupled to a gate of a power switch is detected.

At step 704, a controller determines whether an inductor current reduces to zero based upon a first comparison between the first current and a first predetermined current level.

At step 706, after determining the inductor current reduces to zero, the controller determines whether a drain voltage of the power switch enters a valley of a resonant ringing based upon a second comparison between the first current and the first predetermined current level.

In some embodiments, the inductor current reduces to zero once the first current exceeds the first predetermined current level. After the inductor current reduces to zero, the drain voltage of the power switch enters the valley of the resonant ringing when the first current drops below the first predetermined current level.

In some embodiments, the first clamping device is a first diode having an anode coupled to ground and a cathode coupled to the gate of the power switch.

The method further comprises detecting a second current flowing through a second clamping device coupled to the gate of the power switch, and determining whether the drain voltage of the power switch exits the valley of the resonant ringing based upon a comparison between the second current and a second predetermined current level.

In some embodiments, the drain voltage of the power switch exits the valley of the resonant ringing once the second current exceeds the second predetermined current level.

In some embodiments, the second clamping device is a second diode having an anode coupled to the gate of the power switch and a cathode coupled to ground.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   detecting a first current flowing through a first clamping device coupled to a gate of a power switch;
   determining whether an inductor current reduces to zero upon a first comparison between the first current and a first predetermined current level; and
   after determining the inductor current reduces to zero, determining whether a drain voltage of the power switch enters a valley of a resonant ringing directly upon a second comparison between the first current and the first predetermined current level.

2. The method of claim 1, wherein:
   the inductor current reduces to zero once the first current exceeds the first predetermined current level.

3. The method of claim 1, wherein:
   after the inductor current reduces to zero, the drain voltage of the power switch enters the valley of the resonant ringing when the first current drops below the first predetermined current level.

4. The method of claim 1, wherein:
   the first clamping device is a first diode having an anode coupled to ground and a cathode coupled to the gate of the power switch.

5. The method of claim 1, further comprising:
   detecting a second current flowing through a second clamping device coupled to the gate of the power switch; and
   determining whether the drain voltage of the power switch exits the valley of the resonant ringing based upon a comparison between the second current and a second predetermined current level.

6. The method of claim 5, wherein:
the drain voltage of the power switch exits the valley of the resonant ringing once the second current exceeds the second predetermined current level.

7. The method of claim 5, wherein:
the second clamping device is a second diode having an anode coupled to the gate of the power switch and a cathode coupled to ground.

8. A controller comprising:
a driver configured to drive a power switch, the driver comprising a high-side switch and a low-side switch connected in series; and
a first clamping device configured to directly detect a first current including information of when an inductor current reduces to zero, and when a drain voltage of the power switch enters a valley of a resonant ringing.

9. The controller of claim 8, further comprising:
a second clamping device configured to detect a second current indicative of when the drain voltage of the power switch exits the valley of the resonant ringing.

10. The controller of claim 9, wherein:
the first clamping device is a first diode having an anode coupled to ground and a cathode coupled to a gate of the power switch; and
the second clamping device is a second diode having an anode coupled to the gate of the power switch and a cathode coupled to ground.

11. The controller of claim 10, wherein:
the first diode is a first diode-connected transistor; and
the second diode is a second diode-connected transistor.

12. The controller of claim 11, further comprising:
a first transistor, wherein the first transistor and the first diode-connected transistor form a first current mirror;
a first current source configured to generate a first predetermined current level for determining whether the inductor current reduces to zero, and whether the drain voltage of the power switch enters the valley of the resonant ringing, wherein the first current source is connected in series with the first transistor;
a second transistor, wherein the second transistor and the second diode-connected transistor form a second current mirror;
a second current source configured to generate a second predetermined current level for determining whether the drain voltage of the power switch exits the valley of the resonant ringing, wherein the second current source is connected in series with the second transistor;
a first flip-flop circuit having a clock input coupled to a common node of the first current source and the first transistor, a data input coupled to a bias voltage source, a clear input configured to receive a turn-on signal of the power switch through a first inverter, and an output configured to generate a first signal indicative of when the inductor current reduces to zero; and
a second flip-flop circuit having a clock input coupled to the common node of the first current source and the first transistor, a data input coupled to the bias voltage source, a clear input coupled to a common node of the second current source and the second transistor, and an output configured to generate a second signal indicative of when the drain voltage of the power switch enters the valley of the resonant ringing.

13. The controller of claim 12, further comprising:
a one-shot circuit having an input configured to receive an inverted signal of the turn-on signal of the power switch, and an output configured to generate a short pulse, wherein the short pulse is configured such that after the short pulse finishes, the low-side switch operates in a high impedance state.

14. The controller of claim 13, further comprising:
a switch connected between the second diode-connected transistor and ground, wherein the switch is configured to be turned off after the turn-on signal is applied to the power switch;
a first Schmitt trigger and a second inverter connected in series between the common node of the first current source and the first transistor, and the clock input of the first flip-flop circuit;
a second Schmitt trigger connected between the common node of the second current source and the second transistor, and the clear input of the second flip-flop circuit; and
an AND gate having a first input connected to the output of the second flip-flop circuit, a second input connected to a common node of the first Schmitt trigger and the second inverter, a third input connected to the output of the one-shot circuit through a third inverter.

15. The controller of claim 8, further comprising a second clamping device configured to detect a second current indicative of when the drain voltage of the power switch exits the valley of the resonant ringing, wherein:
the first clamping device is a first active clamp comprising a first switch, a resistor, a first amplifier and a current source, and wherein:
the first switch having a drain connected to a gate of the power switch and a source connected to ground;
the first amplifier having an inverting input connected to the current source, a non-inverting input configured to receive a reference and an output connected to a gate of the first switch; and
the resistor is connected between the inverting input of the first amplifier and the gate of the power switch, wherein the first clamping device is configured to provide a negative voltage clamp for the gate of the power switch; and
the second clamping device is a second active clamp comprising a second switch and a second amplifier, and wherein:
the second switch having a drain connected to the gate of the power switch and a source connected to ground; and
the second amplifier having a non-inverting input connected to the gate of the power switch, an inverting input configured to receive the reference and an output connected to a gate of the second switch, wherein the second clamping device is configured to provide a positive voltage clamp for the gate of the power switch.

16. The controller of claim 8, wherein:
the low-side switch is configured to generate a signal indicative of when the drain voltage of the power switch exits the valley of the resonant ringing.

17. A system comprising:
a power converter comprising an inductor and a power switch connected in series between an input port and ground; and
a controller configured to generate a gate drive signal fed into a gate of the power switch, wherein the controller comprises:
a driver configured to drive the power switch;
a first clamping device configured to detect a first current including information of when an inductor current reduces to zero, and when a drain voltage of the power switch enters a valley of a resonant ringing; and a second clamping device configured to directly detect a second current including information of when the drain voltage of the power switch exits the valley of the resonant ringing.

18. The system of claim 17, wherein:
the driver comprises a high-side switch and a low-side switch connected in series between a bias voltage source and ground, and wherein a common node of the high-side switch and the low-side switch is coupled to the gate of the power switch.

19. The system of claim 17, wherein:
the first clamping device is a first diode having an anode coupled to ground and a cathode coupled to the gate of the power switch, and wherein the first diode is a first diode-connected transistor; and
the second clamping device is a second diode having an anode coupled to the gate of the power switch and a cathode coupled to ground, and wherein the second diode is a second diode-connected transistor.

20. The system of claim 17, wherein:
the first clamping device is a first active clamp comprising a first switch, a resistor, a first amplifier and a current source, and wherein:

the first switch having a drain connected to a gate of the power switch and a source connected to ground;
the first amplifier having an inverting input connected to the current source, a non-inverting input configured to receive a reference and an output connected to a gate of the first switch; and
the resistor is connected between the inverting input of the first amplifier and the gate of the power switch, wherein the first clamping device is configured to provide a negative voltage clamp for the gate of the power switch; and the second clamping device is a second active clamp comprising a second switch and a second amplifier, and wherein:
the second switch having a drain connected to the gate of the power switch and a source connected to ground; and
the second amplifier having a non-inverting input connected to the gate of the power switch, an inverting input configured to receive the reference and an output connected to a gate of the second switch, wherein the second clamping device is configured to provide a positive voltage clamp for the gate of the power switch.

* * * * *